United States Patent
Yasutake

(10) Patent No.: US 8,569,733 B2
(45) Date of Patent: Oct. 29, 2013

(54) SEMICONDUCTOR MEMORY DEVICE

(75) Inventor: Nobuaki Yasutake, Yokkaichi (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 151 days.

(21) Appl. No.: 13/314,527

(22) Filed: Dec. 8, 2011

(65) Prior Publication Data

US 2012/0145986 A1    Jun. 14, 2012

(30) Foreign Application Priority Data

Dec. 14, 2010   (JP) ................................ P2010-277962

(51) Int. Cl.
*H01L 47/00*    (2006.01)

(52) U.S. Cl.
USPC .......................................................... 257/4

(58) Field of Classification Search
CPC .. H01L 45/1253; H01L 45/06; G11C 11/005; G11C 13/0007; H01C 11/36
USPC .............. 257/4, 296–313, 533, 595–602, 257/923–924, E27.016–E27.017, 257/E27.019–E27.021, E27.023–E27.025, 257/E27.03–E27.035, E27.037–E27.038, 257/E27.041–27.045, E27.047–E27.048, 257/E27.071, E27.09, E27.092–E27.093, 257/E27.095, E27.101

See application file for complete search history.

(56) References Cited

U.S. PATENT DOCUMENTS

| | | | |
|---|---|---|---|
| 8,395,138 B2 * | 3/2013 | Yamamoto et al. | ............... 257/4 |
| 2003/0036232 A1 * | 2/2003 | Dennison | ....................... 438/257 |
| 2011/0049463 A1 * | 3/2011 | Yamamoto et al. | ............... 257/4 |
| 2011/0075468 A1 * | 3/2011 | Scheuerlein et al. | ......... 365/148 |
| 2011/0133151 A1 * | 6/2011 | Li et al. | ............................. 257/4 |
| 2011/0193051 A1 * | 8/2011 | Nam et al. | ........................ 257/4 |
| 2012/0302029 A1 * | 11/2012 | Mihnea et al. | ............... 438/382 |
| 2012/0319077 A1 * | 12/2012 | Yasuda et al. | ..................... 257/5 |
| 2012/0329222 A1 * | 12/2012 | Choi et al. | .................... 438/237 |

FOREIGN PATENT DOCUMENTS

| JP | 2005-522045 | 7/2005 |
|---|---|---|
| JP | 2007-288008 | 11/2007 |

* cited by examiner

*Primary Examiner* — Dao H Nguyen
*Assistant Examiner* — Tram H Nguyen
(74) *Attorney, Agent, or Firm* — Oblon, Spivak, McClelland, Maier & Neustadt, L.L.P.

(57) ABSTRACT

A memory cell comprises a diode layer, a variable resistance layer, a first electrode layer. The diode layer functions as a rectifier element. The variable resistance layer functions as a variable resistance element. The first electrode layer is provided between the variable resistance layer and the diode layer. The first electrode layer comprises a titanium nitride layer configured by titanium nitride. Where a first ratio is defined as a ratio of titanium atoms to nitrogen atoms in a first region in the titanium nitride layer and a second ratio is defined as a ratio of titanium atoms to nitrogen atoms in a second region which is in the titanium nitride layer and is nearer to the variable resistance layer than is the first region, the second ratio is larger than the first ratio.

20 Claims, 6 Drawing Sheets

US 8,569,733 B2

SEMICONDUCTOR MEMORY DEVICE

CROSS-REFERENCE TO RELATED APPLICATIONS

This application is based upon and claims the benefit of priority from the prior Japanese Patent Application No. 2010-277962, filed on Dec. 14, 2010, the entire contents of which are incorporated herein by reference.

FIELD

Embodiments described in the present specification relate to a semiconductor memory device having memory cells arranged therein, each of the memory cells comprising a variable resistance element and storing data by a change in resistance value of the variable resistance element.

BACKGROUND

In recent years, electrically rewritable resistance-changing type memory such as ReRAM and PRAM is attracting attention. One example of such a resistance-changing type memory includes a variable resistance element and a rectifier element connected in series. The variable resistance element is configured having its resistance value variable, and a memory cell stores data by a change in that resistance value. The rectifier element is provided such that only a selected memory cell is subject to an operation. That is, the rectifier element is provided to prevent current from flowing in an unselected memory cell.

In the above-described kind of memory cell, it is required that both the variable resistance element and the rectifier element have a structure allowing characteristics of these elements to be drawn out to a maximum degree.

DETAILED DESCRIPTION

A semiconductor memory device in embodiments described below comprises memory cells. Each of the memory cells is disposed between a first line and a second line and has a rectifier element and a variable resistance element connected in series. Each of the memory cells comprises a diode layer, a variable resistance layer, and a first electrode layer. The diode layer functions as the rectifier element. The variable resistance layer functions as the variable resistance element. The first electrode layer is provided between the variable resistance layer and the diode layer. The first electrode layer comprises a titanium nitride layer configured by titanium nitride. Where a first ratio is defined as a ratio of titanium atoms to nitrogen atoms in a first region in the titanium nitride layer and a second ratio is defined as a ratio of titanium atoms to nitrogen atoms in a second region which is in the titanium nitride layer and is nearer to the variable resistance layer than is the first region, the second ratio is larger than the first ratio.

The embodiments of the semiconductor memory device are described below with reference to the drawings.

First Embodiment

Configuration

Figure 1:
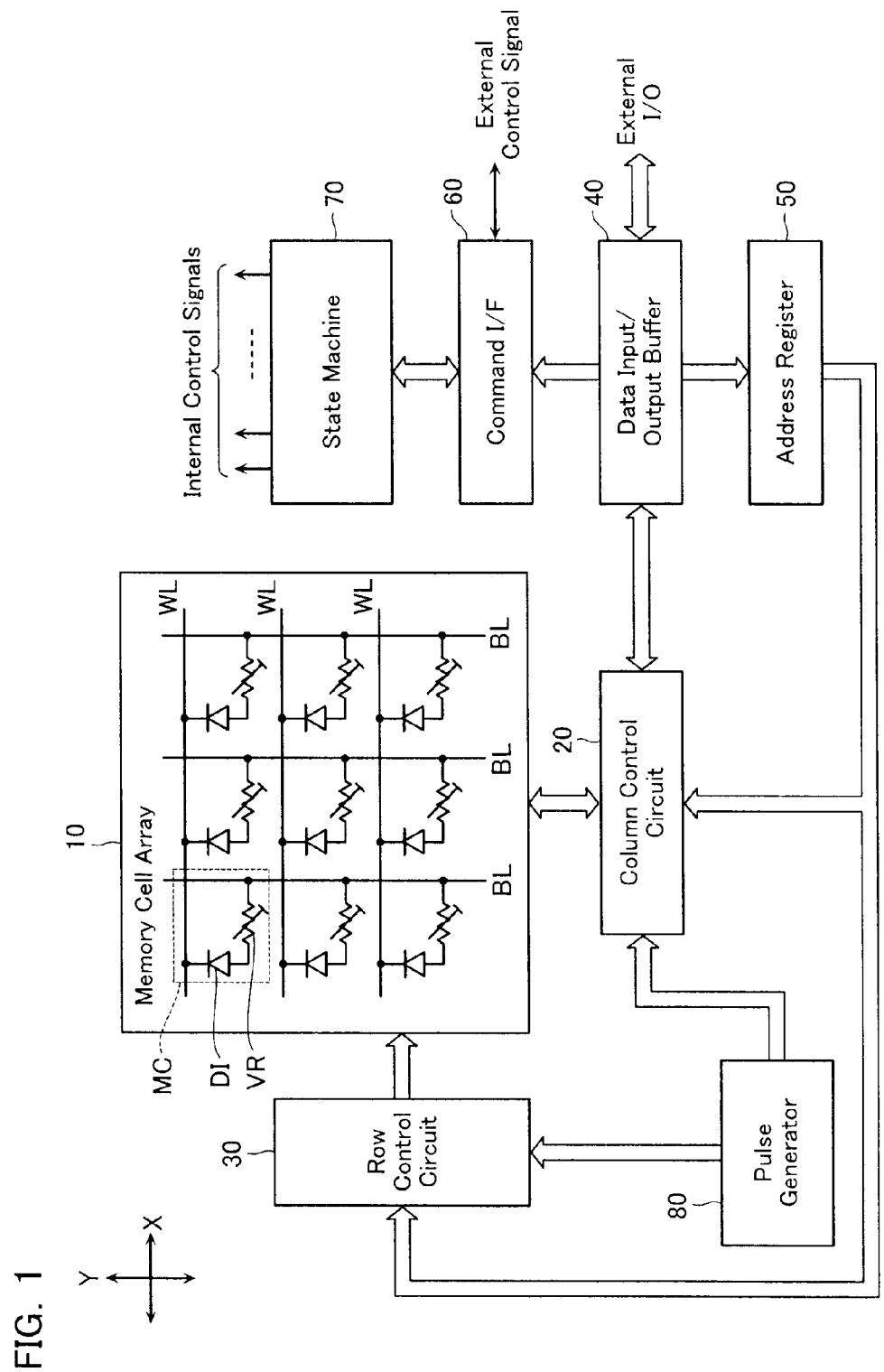
FIG. 1 is a block diagram of a semiconductor memory device according to a first embodiment.

A schematic configuration of the semiconductor memory device according to a first embodiment is described with reference to FIG. 1. As shown in FIG. 1, the semiconductor memory device according to the first embodiment includes a memory cell array 10, a column control circuit 20, a row control circuit 30, a data input/output buffer 40, an address register 50, a command I/F 60, a state machine 70, and a pulse generator 80.

As shown in FIG. 1, the memory cell array 10 includes word lines WL and bit lines BL that intersect each other, and memory cells MC disposed between the word lines WL and the bit lines BL. The word lines WL are formed extending in an X direction and disposed having a certain pitch in a Y direction. The bit lines BL are formed extending in the Y direction and disposed having a certain pitch in the X direction. The memory cells MC are disposed in a matrix in a plane formed by the X direction and the Y direction.

As shown in FIG. 1, each of the memory cells MC includes a diode DI and a variable resistance element VR connected in series. A cathode of the diode DI is connected to the word line WL, and an anode of the diode DI is connected to one end of the variable resistance element VR. The other end of the variable resistance element VR is connected to the bit line BL.

The diode DI is provided having a direction from the bit line BL to the word line WL as a forward direction. The variable resistance element VR is an element that transitions between at least two resistance values, for example, a low-resistance state and a high-resistance state, caused by an applied voltage or other electrical power. The variable resistance element VR stores data in a nonvolatile manner based on the resistance value.

The column control circuit 20 controls the bit lines BL of the memory cell array 10 to perform data erase of the memory cells MC (resetting operation), data write to the memory cells MC (setting operation), and data read from the memory cells MC.

The row control circuit 30 selects the word lines WL of the memory cell array 10 to apply a voltage required in data erase of the memory cells MC (resetting operation), data write to the memory cells MC (setting operation), and data read from the memory cells MC.

The data input/output buffer 40 is connected via an I/O line to an external host not illustrated, to receive write data and erase commands, to output read data, and to receive address data or command data. The data input/output buffer 40 sends received write data to the column control circuit 20 and receives data read from the column control circuit 20 and outputs the read data to external.

The address register 50 sends addresses supplied from external to the data input/output buffer 40, to the column control circuit 20 and the row control circuit 30.

The command interface 60 receives commands supplied from the host to the data input/output buffer 40. The command interface 60 receives an external control signal from the host, judges whether data inputted to the data input/output buffer 40 is write data, a command, or an address. If the data is a command, the command interface 60 transfers the data to the state machine 70 as a command signal.

The state machine 70 performs overall management of this nonvolatile memory to receive commands from the host and perform read, write, erase, and management of input/output of data, and so on. In addition, the external host may also receive status information managed by the state machine 70 to judge an operation result. Moreover, this status information is also utilized in control of write and erase.

The pulse generator 80 is controlled by the state machine 70. This control enables the pulse generator 80 to output a pulse of any voltage with any timing. The pulse formed herein may be transferred to any line selected by the column control circuit 20 and the row control circuit 30. Note that peripheral circuit elements other than the memory cell array 10 may be formed in a Si substrate directly below the memory cell array 10, whereby a chip area of this nonvolatile memory can be made approximately equal to an area of the memory cell array 10.

Figure 2:
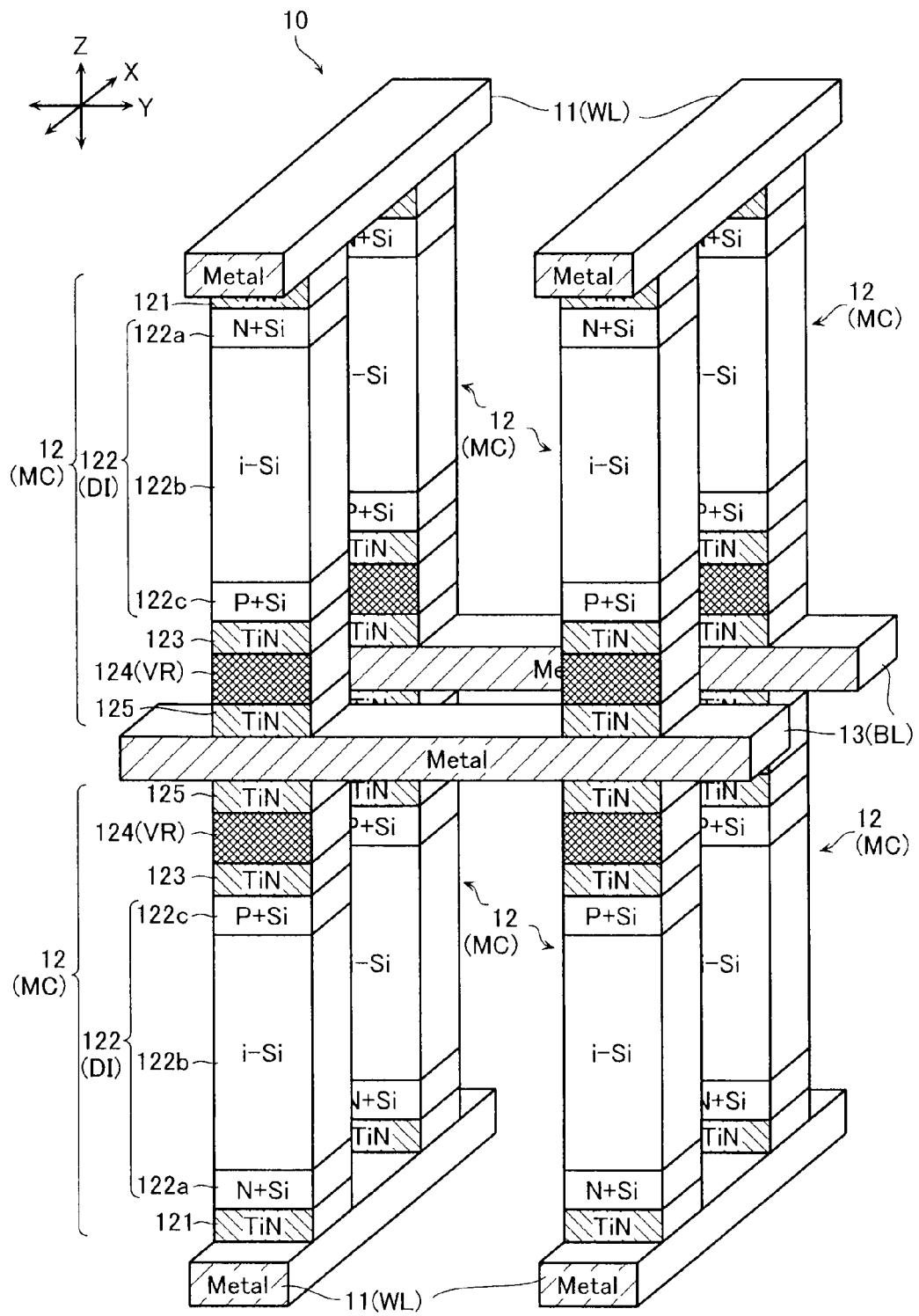
FIG. 2 is a perspective view showing a memory cell array 10.

Next, a stacking structure of the memory cell array 10 according to the first embodiment is described in detail with reference to FIG. 2. FIG. 2 is a perspective view showing the memory cell array 10. The memory cell array 10 is configured as a so-called cross-point type.

As shown in FIG. 2, the memory cell array 10 includes, from a lower layer to an upper layer, a first conductive layer 11, a memory layer 12, a second conductive layer 13, a memory layer 12, and a first conductive layer 11. That is, one second conductive layer 13 is shared by two memory layers 12 positioned above and below the one second conductive layer 13 in a Z direction. The first conductive layer 11 functions as the word line WL. The memory layer 12 functions as the memory cell MC. The second conductive layer 13 functions as the bit line BL.

As shown in FIG. 2, the first conductive layer 11 is formed in stripes extending in the X direction and having a certain pitch in the Y direction. The first conductive layer 11, which is preferably of a heat-resistant and low resistance material, is configured by, for example, any of tungsten (W), tungsten silicide (WSi), nickel silicide (NiSi), or cobalt silicide (CoSi).

As shown in FIG. 2, the memory layer 12 is provided between the first conductive layer 11 and the second conductive layer 13, and is formed to contact the first conductive layer 11 and the second conductive layer 13. The memory layer 12 is arranged in a matrix in the X direction and the Y direction.

As shown in FIG. 2, the second conductive layer 13 is formed in stripes extending in the Y direction and having a certain pitch in the X direction. The second conductive layer 13, which is preferably of a heat-resistant and low resistance material, is configured by, for example, any of tungsten (W), tungsten silicide (WSi), nickel silicide (NiSi), or cobalt silicide (CoSi).

Next, a configuration of the memory layer 12 is described in detail. As shown in FIG. 2, the memory layer 12 includes, arranged in line in the Z direction from the first conductive layer 11 side to the second conductive layer 13 side, an electrode layer 121, a diode layer 122, an electrode layer 123, a variable resistance layer 124, and an electrode layer 125.

The electrode layer 121 is provided between the first conductive layer 11 and the diode layer 122, and is formed to contact the first conductive layer 11 and the diode layer 122. The electrode layer 121 is configured by titanium nitride (TiN$_x$). The electrode layer 121 has a film thickness of 10 nm or less. Provided that the electrode layer 121 (titanium nitride) has a film thickness of about 3 nm-10 nm, the electrode layer 121 (titanium nitride) does not affect withstand voltage of the diode DI. However, if the electrode layer 121 (titanium nitride) has a film thickness greater than 10 nm, a thickness of the stacking structure of the memory cell increases, thereby increasing aspect ratio during processing. Hence, film thickness of the electrode layer 121 is preferably 10 nm or less.

The diode layer 122 is provided between the electrode layer 121 and the electrode layer 123, and is formed to contact the electrode layer 121 and the electrode layer 123. The diode layer 122 functions as the diode DI. Note that a detailed configuration of the diode layer 122 is described later.

The electrode layer 123 is provided between the diode layer 122 and the variable resistance layer 124, and is formed to contact the diode layer 122 and the variable resistance layer 124. The electrode layer 123 has a film thickness of 10 nm or less. Note that a detailed configuration of the electrode layer 123 is described later.

The variable resistance layer 124 is provided between the electrode layer 123 and the electrode layer 125, and is formed to contact the electrode layer 123 and the electrode layer 125. The variable resistance layer 124 is configured by, for example, hafnium oxide (HfO). The variable resistance layer 124 functions as the variable resistance element VR.

The electrode layer 125 is provided between the variable resistance layer 124 and the second conductive layer 13, and is formed to contact the variable resistance layer 124 and the second conductive layer 13. The electrode layer 125 is configured by titanium nitride (TiN$_x$). The electrode layer 125 has a film thickness of 10 nm or less.

Next, the configuration of the diode layer 122 is described in detail. As shown in FIG. 2, the diode layer 122 includes, arranged in line in the Z direction from the first conductive layer 11 side to the second conductive layer 13 side, an N+ type semiconductor layer 122a, an intrinsic semiconductor layer 122b, and a P+ type semiconductor layer 122c.

The N+ type semiconductor layer 122a is provided between the electrode layer 121 and the intrinsic semiconductor layer 122b, and is formed to contact the electrode layer 121 and the intrinsic semiconductor layer 122b. The N+ type semiconductor layer 122a is configured by epitaxially-grown polysilicon implanted with phosphorus (P) or arsenic (As). A concentration of N type impurity included in the N+ type semiconductor layer 122a is $1 \times 10^{20}$ atms/cm$^3$ or more. The N+ type semiconductor layer 122a has a film thickness of 20 nm or less.

The intrinsic semiconductor layer 122b is provided between the N+ type semiconductor layer 122a and the P+ type semiconductor layer 122c, and is formed to contact the N+ type semiconductor layer 122a and the P+ type semiconductor layer 122c. The intrinsic semiconductor layer 122b is configured by epitaxially-grown polysilicon. The intrinsic semiconductor layer 122b has a film thickness of 60 nm-120 nm.

The P+ type semiconductor layer 122c is provided between the intrinsic semiconductor layer 122b and the electrode layer 123, and is formed to contact the intrinsic semiconductor layer 122b and the electrode layer 123. The P+ type semiconductor layer 122c is configured by epitaxially-grown polysilicon implanted with boron (B). A concentration of P type impurity included in the P+ type semiconductor layer 122c is 1×10²⁰ atms/cm³ or more. The P+ type semiconductor layer 122c has a film thickness of about 20 nm.

Figure 3:
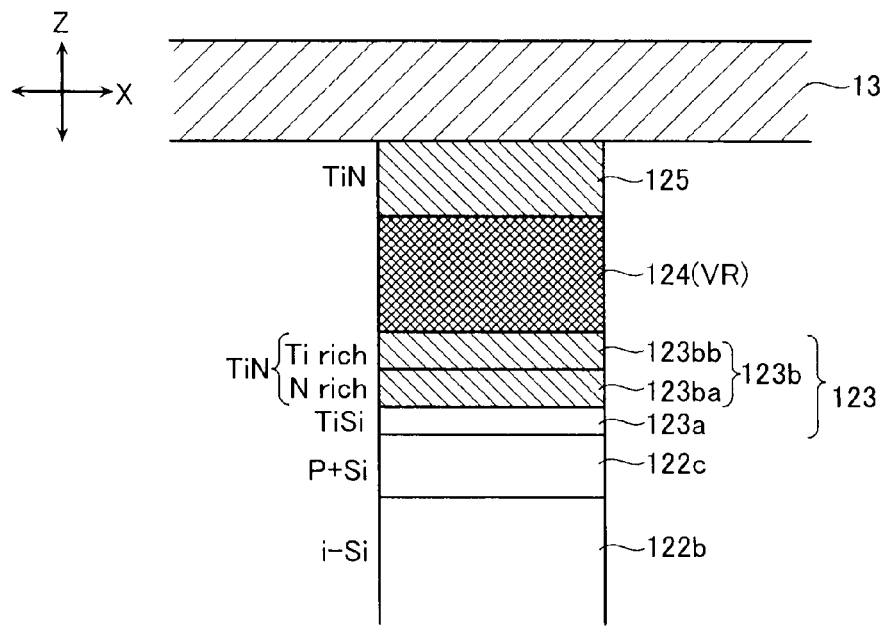
FIG. 3 is an enlarged view of FIG. 2.

Next, the configuration of the electrode layer 123 is described in detail with reference to FIG. 3 which is an enlarged view of FIG. 2. As shown in FIG. 3, the electrode layer 123 includes, arranged in line in the Z direction from the first conductive layer 11 side to the second conductive layer 13 side, a silicide layer 123a and a titanium nitride layer 123b.

The silicide layer 123a is configured by titanium silicide (TiSi). The silicide layer 123a is provided between the P+ type semiconductor layer 122c and the titanium nitride layer 123b, and is formed to contact the P+ type semiconductor layer 122c and the titanium nitride layer 123b. As mentioned later, the silicide layer 123a is formed by part of the P+ type semiconductor layer 122c being silicided due to formation of the titanium nitride layer 123b.

The titanium nitride layer 123b is configured by titanium nitride (TiN$_x$). The titanium nitride layer 123b is provided between the silicide layer 123a and the variable resistance layer 124, and is formed to contact the silicide layer 123a and the variable resistance layer 124.

The titanium nitride layer 123b includes a first titanium nitride layer 123ba and a second titanium nitride layer 123bb. The first titanium nitride layer 123ba is configured to have more nitrogen atoms than titanium atoms in a unit volume. The first titanium nitride layer 123ba is provided between the silicide layer 123a and the second titanium nitride layer 123bb, and is formed to contact the silicide layer 123a and the second titanium nitride layer 123bb.

The second titanium nitride layer 123bb is configured to have more titanium atoms than nitrogen atoms in a unit volume. The second titanium nitride layer 123bb is provided between the first titanium nitride layer 123ba and the variable resistance layer 124, and is formed to contact the first titanium nitride layer 123ba and the variable resistance layer 124.

The above-described configuration of the titanium nitride layer 123b can be expressed in other words as follows. That is, a first ratio is defined as a ratio of titanium atoms to nitrogen atoms in the first titanium nitride layer 123ba (first region) in the titanium nitride layer 123b, and a second ratio is defined as a ratio of titanium atoms to nitrogen atoms in the second titanium nitride layer 123bb (second region) which is in the titanium nitride layer 123b and is nearer to the variable resistance layer 124 than is the first titanium nitride layer 123ba. In this case, the second ratio is larger than the first ratio.

Now, when the variable resistance layer 124 is configured by a metal oxide such as hafnium oxide, the higher the ratio of titanium atoms in the electrode layer 123 contacting the variable resistance layer 124, the higher a switching characteristic of the variable resistance element VR.

Therefore, in the first embodiment, the second titanium nitride layer 123bb contacting the variable resistance layer 124 is configured to have more titanium atoms than nitrogen atoms. Consequently, in the first embodiment, the switching characteristic of the variable resistance element VR is high.

On the other hand, the higher the ratio of titanium atoms in the electrode layer 123 contacting the diode layer 122, the wider a range in which siliciding of the diode layer 122 advances. Now, a resistance $\rho_c$ between the silicide layer 123a and the diode layer 122 can be expressed by Formula 1 as follows, $$\rho_c \propto \exp(\phi_B/\sqrt{N_D})$$ (Formula 1), where $\phi_B$ is a potential height of a Schottky barrier, and $N_D$ is an interface impurity concentration between the silicide layer 123a and the diode layer 122.

Figure 4:
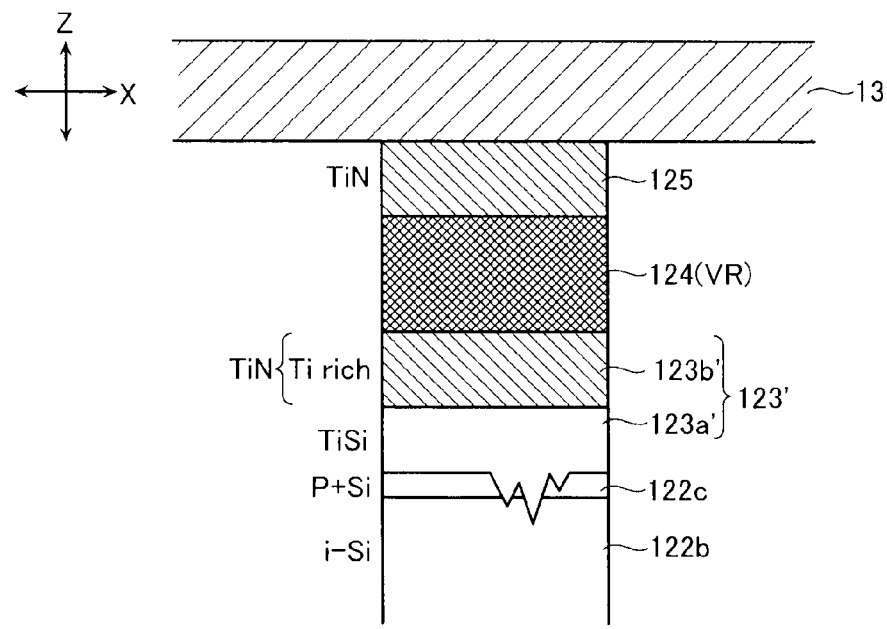
FIG. 4 is a cross-sectional view of a memory cell array 10 according to a comparative example.

FIG. 4 shows one example of an electrode layer 123' having a titanium nitride layer 123b' configured to have more titanium atoms than nitrogen atoms. In this case, a silicide layer 123a' below the titanium nitride layer 123b' reaches the P+ type semiconductor layer 122c and the intrinsic semiconductor layer 122b. As a result, the interface impurity concentration $N_D$ shown in Formula 1 falls, and the resistance $\rho_c$ increases. That is, a forward direction current characteristic of the diode DI deteriorates significantly.

In contrast, in the first embodiment, the first titanium nitride layer 123ba contacting the diode layer 122 via the silicide layer 123a is configured to have more nitrogen atoms than titanium atoms. Therefore, in the first embodiment, a fall in the forward direction current characteristic of the diode DI is suppressed.

Summarizing the above, in the first embodiment, the second titanium nitride layer 123bb is configured to have more titanium atoms than nitrogen atoms, and the first titanium nitride layer 123ba is configured to have more nitrogen atoms than titanium atoms. As a result, the first embodiment suppresses a fall in the switching characteristic of the variable resistance element VR and a fall in the forward direction current characteristic of the diode DI (suppresses deterioration in characteristics of the memory cell MC).

[Method of Manufacturing]

Next, a method of manufacturing the semiconductor memory device according to the first embodiment is described with reference to FIGS. 5-8.

Figure 5:
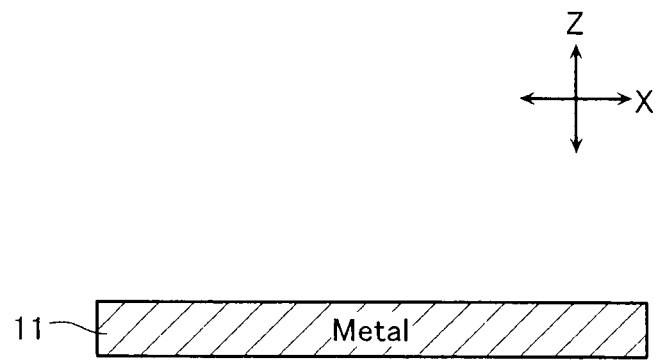
FIG. 5 is a cross-sectional view showing a manufacturing process of the semiconductor memory device according to the first embodiment.

First, as shown in FIG. 5, the first conductive layer 11 is formed. The first conductive layer 11 is formed on the silicon substrate via an insulating layer (omitted from the drawing). Now, a control circuit (peripheral circuit) for controlling the memory cell array 10 may be formed between the first conductive layer 11 and the silicon substrate.

Figure 6:
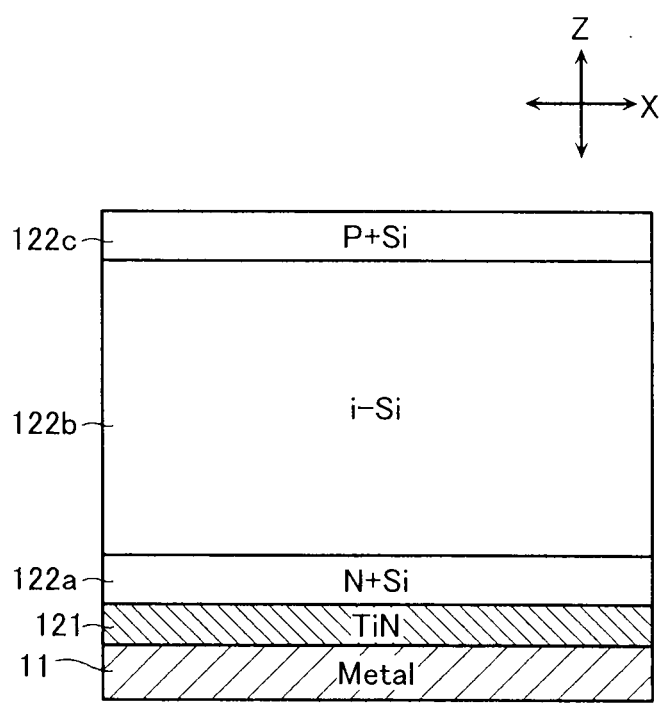
FIG. 6 is a cross-sectional view showing a manufacturing process of the semiconductor memory device according to the first embodiment.

Next, as shown in FIG. 6, deposited on the first conductive layer 11 are the electrode layer 121, the N+ type semiconductor layer 122a, the intrinsic semiconductor layer 122b, and the P+ type semiconductor layer 122c. Now, the N+ type semiconductor layer 122a is formed by causing epitaxial growth of polysilicon, and implanting phosphorus (P) or arsenic (As) into that epitaxially-grown polysilicon. The intrinsic semiconductor layer 122b is formed by causing epitaxial growth of polysilicon. The P+ type semiconductor layer 122c is formed by causing epitaxial growth of polysilicon, and implanting boron (B) into that epitaxially-grown polysilicon.

Figure 7:
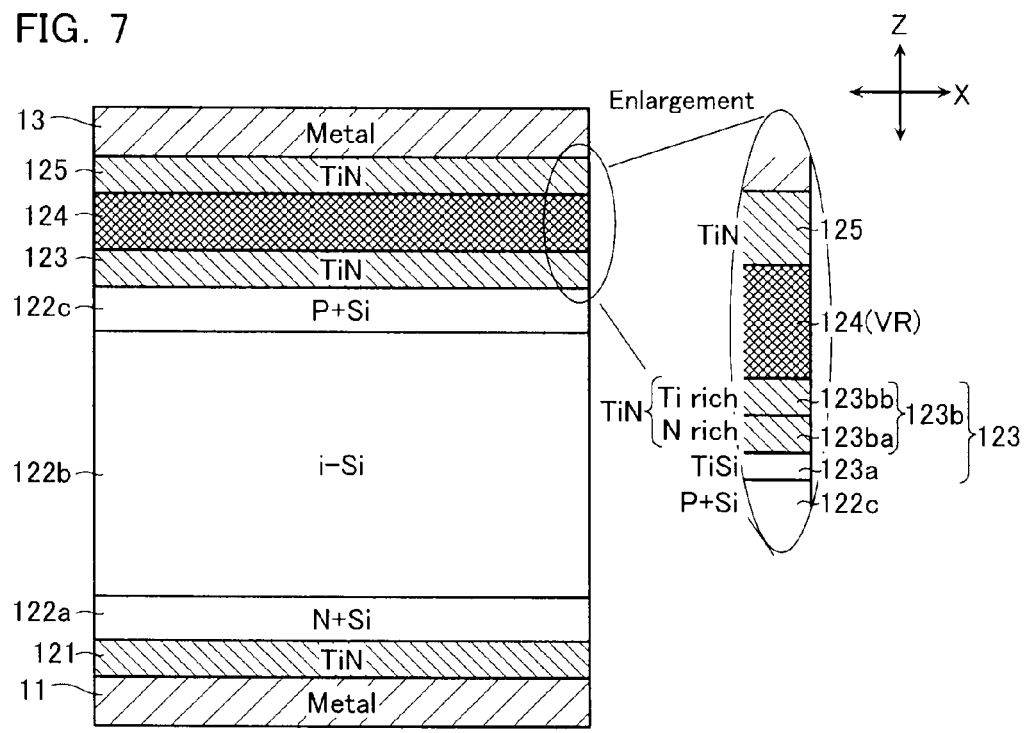
FIG. 7 is a cross-sectional view showing a manufacturing process of the semiconductor memory device according to the first embodiment.

Then, as shown in FIG. 7, deposited on the P+ type semiconductor layer 122c are the electrode layer 123, the variable resistance layer 124, the electrode layer 125, and the second conductive layer 13. Now, as a result of forming the electrode layer 123 that includes titanium on the P+ type semiconductor layer 122c, part of the P+ type semiconductor layer 122c is silicided to become the silicide layer 123a. The electrode layer 123 is formed using a sputtering method.

Figure 8:
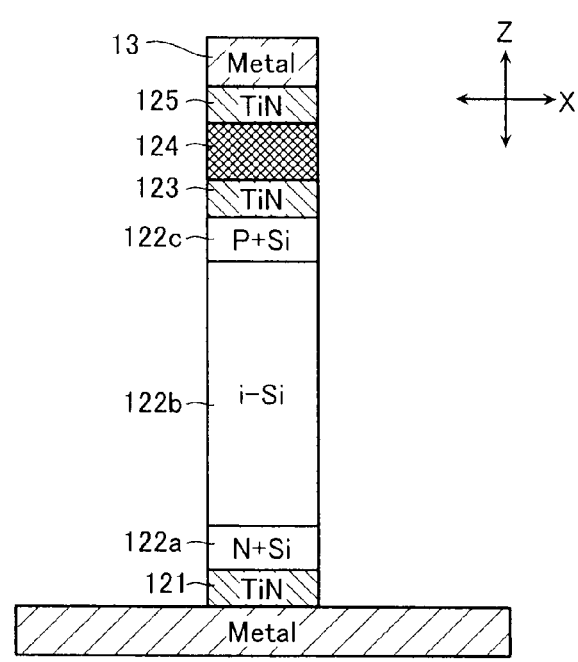
FIG. 8 is a cross-sectional view showing a manufacturing process of the semiconductor memory device according to the first embodiment.

Next, as shown in FIG. 8, the electrode layer 121 through second conductive layer 13 are processed. The above processes result in formation of the memory layer 12 positioned in a lower layer of the memory cell array 10 shown in FIG. 2.

Second Embodiment

Next, a configuration of a semiconductor memory device according to a second embodiment is described with reference to FIG. 9. The second embodiment differs from the first embodiment only in configuration of the electrode layer 123. Note that in the second embodiment, identical symbols are assigned to configurations similar to those in the first embodiment, and a description of such similar configurations is omitted.

Figure 9:
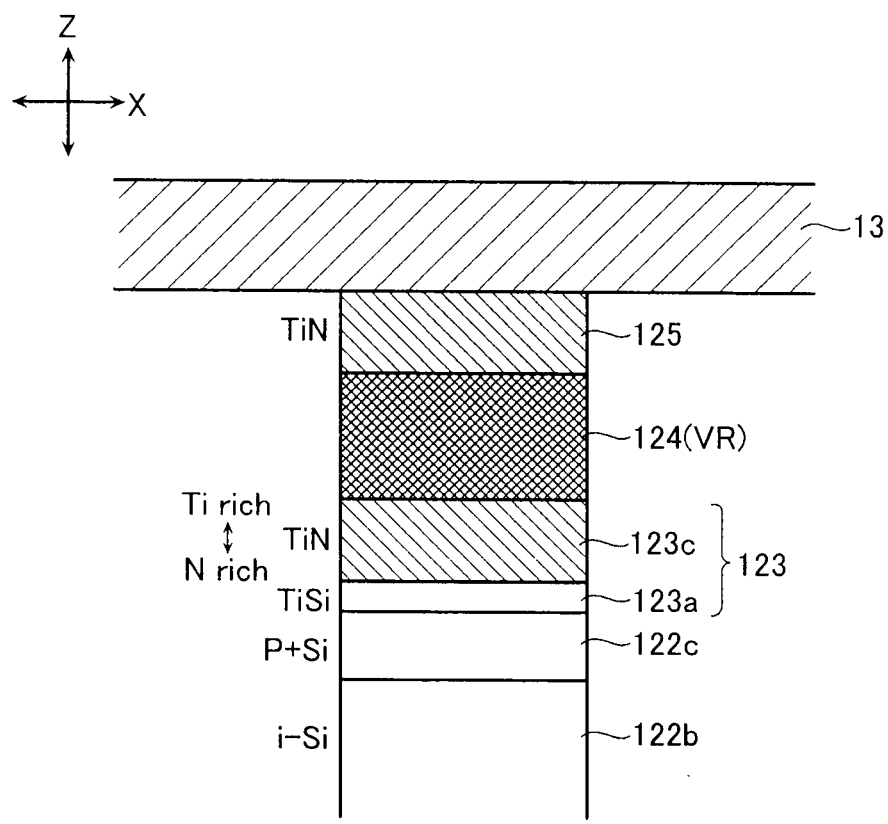
FIG. 9 is an enlarged cross-sectional view of a memory cell array 10 in a semiconductor memory device according to a second embodiment.

As shown in FIG. 9, the electrode layer 123 includes, arranged in line in the Z direction from the first conductive layer 11 side to the second conductive layer 13 side, the silicide layer 123a and the titanium nitride layer 123c.

The titanium nitride layer 123c is configured by titanium nitride (TiNx), similarly to in the first embodiment. Moreover, the titanium nitride layer 123c is provided between the silicide layer 123a and the variable resistance layer 124, and is formed to contact the silicide layer 123a and the variable resistance layer 124.

On the other hand, the titanium nitride layer 123c differs from that of the first embodiment in having a concentration gradient of titanium atoms in the Z direction. Specifically, the titanium nitride layer 123c is configured such that the ratio of titanium atoms to nitrogen atoms in the titanium nitride layer 123c gradually reduces as a position thereof is closer to the diode layer 122 than the variable resistance layer 124.

The above-described configuration of the titanium nitride layer 123c can be expressed in other words as follows. That is, a first ratio is defined as a ratio of titanium atoms to nitrogen atoms in a first region in the titanium nitride layer 123c, and a second ratio is defined as a ratio of titanium atoms to nitrogen atoms in a second region which is in the titanium nitride layer 123c and is nearer to the variable resistance layer 124 than is the first region. In this case, the second ratio is larger than the first ratio.

The above-described configuration results in the second embodiment displaying similar advantages to the first embodiment. Note that the semiconductor memory device according to the second embodiment may be manufactured by similar processes to those of the first embodiment.

While certain embodiments of the inventions have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

For example, in the first embodiment shown in FIG. 2, one second conductive layer 13 is shared by the memory layers 12 positioned above and below the second conductive layer 13. However, the second conductive layer 13 may be provided one to each of the memory layers 12 positioned above or below it.

What is claimed is:

1. A semiconductor memory device, comprising memory cells each disposed between a first line and a second line and each having a rectifier element and a variable resistance element connected in series,
    each of the memory cells comprising:
    a diode layer functioning as the rectifier element;
    a variable resistance layer functioning as the variable resistance element; and
    a first electrode layer provided between the variable resistance layer and the diode layer,
    the first electrode layer comprising a titanium nitride layer configured by titanium nitride,
    and, when a first ratio is defined as a ratio of titanium atoms to nitrogen atoms in a first region in the titanium nitride layer and a second ratio is defined as a ratio of titanium atoms to nitrogen atoms in a second region which is in the titanium nitride layer and is nearer to the variable resistance layer than is the first region, the second ratio being larger than the first ratio.

2. The semiconductor memory device according to claim 1, wherein
    the titanium nitride layer comprises:
    a first titanium nitride layer configured to have more nitrogen atoms than titanium atoms in a unit volume; and
    a second titanium nitride layer provided between the first titanium nitride layer and the variable resistance layer and configured to have more titanium atoms than nitrogen atoms in a unit volume.

3. The semiconductor memory device according to claim 1, wherein
    the titanium nitride layer is configured such that the ratio of titanium atoms to nitrogen atoms in the titanium nitride layer gradually reduces as a position thereof is closer to the diode layer than the variable resistance layer.

4. The semiconductor memory device according to claim 1, wherein
    the titanium nitride layer has a film thickness of 10 nm or less.

5. The semiconductor memory device according to claim 1, wherein
    the diode layer comprises:
    a first semiconductor layer having N type conductive property; and
    a second semiconductor layer having P type conductive property and provided between the first semiconductor layer and the first electrode layer, and
    a concentration of N type impurities included in the first semiconductor layer is $1 \times 10^{20}$ atms/cm$^3$ or more.

6. The semiconductor memory device according to claim 5, wherein
    a concentration of P type impurities included in the second semiconductor layer is $1 \times 10^{20}$ atms/cm$^3$ or more.

7. The semiconductor memory device according to claim 5, wherein
    the diode layer further comprises an intrinsic semiconductor layer provided between the first semiconductor layer and the second semiconductor layer.

8. The semiconductor memory device according to claim 1, wherein
    the first electrode layer further comprises a silicide layer provided between the titanium nitride layer and the diode layer.

9. The semiconductor memory device according to claim 8, wherein
    the silicide layer is configured by titanium silicide.

10. The semiconductor memory device according to claim 1, wherein
    each of the memory cells further comprises a second electrode layer provided between the first line and the diode layer.

11. The semiconductor memory device according to claim 10, wherein
    the second electrode layer is configured by titanium nitride.

12. The semiconductor memory device according to claim 11, wherein
    the second electrode layer has a film thickness of 10 nm or less.

13. The semiconductor memory device according to claim 1, wherein each of the memory cells further comprises a second electrode layer provided between the second line and the variable resistance layer.

14. The semiconductor memory device according to claim 13, wherein
the second electrode layer is configured by titanium nitride.

15. The semiconductor memory device according to claim 14, wherein
the second electrode layer has a film thickness of 10 nm or less.

16. The semiconductor memory device according to claim 1, wherein
the variable resistance layer is configured by hafnium oxide.

17. The semiconductor memory device according to claim 1, wherein
the first line is configured by any of tungsten, tungsten silicide, nickel silicide, or cobalt silicide.

18. The semiconductor memory device according to claim 1, wherein
the second line is configured by any of tungsten, tungsten silicide, nickel silicide, or cobalt silicide.

19. The semiconductor memory device according to claim 1, wherein
the second line is shared by a pair of memory cells positioned above and below the second line.

20. The semiconductor memory device according to claim 1, further comprising:
a memory cell array including a plurality of the memory cells; and
a peripheral circuit configured to control the memory cell array,
wherein the peripheral circuit is positioned directly below the memory cell array.

* * * * *